United States Patent
Khoueir et al.

(10) Patent No.: US 9,727,459 B2
(45) Date of Patent: Aug. 8, 2017

(54) NON-VOLATILE, SOLID-STATE MEMORY CONFIGURED TO PERFORM LOGICAL COMBINATION OF TWO OR MORE BLOCKS SHARING SERIES-CONNECTED BIT LINES

(71) Applicant: Seagate Technology LLC, Cupertino, CA (US)

(72) Inventors: Antoine Khoueir, Edina, MN (US); Ryan James Goss, Prior Lake, MN (US); Jon Trantham, Chanhassen, MN (US); Kevin Gomez, Eden Prairie, MN (US); Frank Dropps, Maple Grove, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 405 days.

(21) Appl. No.: 14/466,143

(22) Filed: Aug. 22, 2014

(65) Prior Publication Data

US 2016/0054940 A1 Feb. 25, 2016

(51) Int. Cl.
*G06F 12/06* (2006.01)
*G11C 7/00* (2006.01)
*G06F 3/06* (2006.01)
*G06F 12/00* (2006.01)
*G11C 7/10* (2006.01)
*G11C 16/04* (2006.01)
*G11C 16/26* (2006.01)
*G11C 15/04* (2006.01)

(52) U.S. Cl.
CPC .......... *G06F 12/06* (2013.01); *G06F 3/064* (2013.01); *G06F 3/0619* (2013.01); *G06F 3/0655* (2013.01); *G06F 3/0679* (2013.01); *G06F 12/00* (2013.01); *G06F 12/0638* (2013.01); *G11C 7/00* (2013.01); *G11C 7/1006* (2013.01); *G11C 15/046* (2013.01); *G11C 16/0483* (2013.01); *G11C 16/26* (2013.01); *G06F 2206/1014* (2013.01); *G11C 2211/5641* (2013.01)

(58) Field of Classification Search
CPC ...... G06F 3/0619; G06F 3/0679; G06F 3/064; G06F 3/0655; G06F 2206/1014
See application file for complete search history.

(56) References Cited

U.S. PATENT DOCUMENTS

| | | | |
|---|---|---|---|
| 8,169,808 B2 | 5/2012 | Roohparvar | |
| 8,364,739 B2 | 1/2013 | Baskaran et al. | |
| 8,583,586 B2 | 11/2013 | Ebadollahi et al. | |
| 8,634,248 B1 | 1/2014 | Sprouse et al. | |
| 2003/0018868 A1* | 1/2003 | Chung | G06F 9/3879 711/168 |

(Continued)

*Primary Examiner* — Harry W Byrne
*Assistant Examiner* — Ajay Ojha
(74) *Attorney, Agent, or Firm* — Hollingsworth Davis, LLC (57) ABSTRACT

First and second data representation are stored in first and second blocks of a non-volatile, solid-state memory. The first and second blocks share series-connected bit lines. The first and second blocks are selected and other blocks of the non-volatile, solid-state memory that share the bit lines are deselected. The bit lines are read to determine a combination of the first and second data representations. The combination may include a union or an intersection.

20 Claims, 9 Drawing Sheets

(56) References Cited

U.S. PATENT DOCUMENTS

| | | | |
|---|---|---|---|
| 2009/0141566 A1* | 6/2009 | Arsovski | G11C 7/1006 365/189.15 |
| 2009/0254694 A1* | 10/2009 | Ehrman | G11C 7/1006 711/100 |
| 2013/0028021 A1 | 1/2013 | Sharon et al. | |
| 2015/0356009 A1* | 12/2015 | Wheeler | G06F 12/0638 711/170 |

* cited by examiner

FIG. 1

```
SDR1  0 0 0 0 0 0 0 1 0 0 0 1 0 0 0
SDR2  0 0 0 1 0 0 0 0 0 0 0 1 0 0 0
SDR3  1 0 0 0 0 0 0 0 0 0 0 0 1 0 0
SDR4  0 0 0 1 1 0 0 0 0 0 0 0 0 0 0
SDR5  1 0 0 0 0 0 1 0 0 0 0 0 0 0 0
SDR6  0 0 1 0 0 0 0 0 0 0 0 0 1 0 0
      ─────────────────────────────
Union 1 0 1 1 1 0 0 1 0 0 0 1 1 0 0
```

NON-VOLATILE, SOLID-STATE MEMORY CONFIGURED TO PERFORM LOGICAL COMBINATION OF TWO OR MORE BLOCKS SHARING SERIES-CONNECTED BIT LINES

SUMMARY

The present disclosure is related to storage compute devices. In one embodiment, methods and apparatuses facilitate combining data blocks in a non-volatile, solid-state memory. In one embodiment, first and second data representation are stored in first and second blocks of a non-volatile, solid-state memory. The first and second blocks share series-connected bit lines. The first and second blocks are selected and other blocks of the non-volatile, solid-state memory that share the bit lines are deselected. The bit lines are read to determine a combination of the first and second data representations, wherein the combination comprises one of a union or an intersection.

In another embodiment, data representations are stored in blocks of non-volatile memory that share series-connected bit lines. First bits of a first of the blocks are read into a register of a memory controller of the non-volatile memory. Second bits of a second of the blocks are read into the register. The register performs a bitwise combination of the first bits with respective ones of the second bits.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures. The drawings are not necessarily to scale.

DETAILED DESCRIPTION

Some computational tasks are suited for massively distributed computing solutions. For example, data centers that provide web services, email, data storage, Internet search, etc., often distribute tasks among hundreds or thousands of computing nodes. The nodes are interchangeable and tasks may be performed in parallel by multiple computing nodes. This parallelism increases processing and communication speed, as well as increasing reliability through redundancy. Generally, the nodes may include rack mounted computers that are designed to be compact and power efficient, but otherwise operate similarly to desktop computer or server.

For certain types of tasks, it may be desirable to rearrange how data is processed within the individual nodes. For example, applications such as neuromorphic computing, scientific simulations, etc., may utilize large matrices that are processed in parallel by multiple computing nodes. In a traditional computing setup, matrix data may be stored in random access memory and/or non-volatile memory, where it is retrieved, operated on by relatively fast central processor unit (CPU) cores, and the results sent back to volatile and/or non-volatile memory. It has been shown that the bus lines and I/O protocols between the CPU cores and the memory can be a bottleneck for some types of computation.

This disclosure generally relates to use of a data storage device that performs internal computations on data on behalf of a host, and is referred to herein as a storage compute device. While a data storage device, such as a hard drive, solid-state drive (SSD), hybrid drive, etc., generally include data processing capabilities, such processing is mostly related to the storage and retrieval of user data. So while the data storage device may perform some computations on the data, such as compression, error correction, etc., these computations are invisible to the host. Similarly, other computations, such as logical-to-physical address mapping, involve tracking host requests, but are intended to hide these tracking operations from the host. In contrast, a storage compute device makes computations based on express or implied instructions from the host, with the intention that some form of a result will be returned to the host and/or be retrievable by the host.

While a storage compute device as described herein may be able to perform as a conventional storage device, e.g., handling host data storage and retrieval requests, such devices may include additional computational capability that can be used for certain applications. For example, scientific and engineering simulations may involve solving equations on very large matrices. Even though the matrices may be sparse, and therefore amenable to a more concise/compressed format for storage, the matrices may be cumbersome to move in and out of storage for performing operations.

An example of using sparse matrix in computations involves what are known as Bloom filters. Generally, a Bloom filter represents a search domain as a vector of N-bits, initially populated by zeroes. Data objects of the search domain are added to the Bloom filter by performing M-number of hash functions on each data object, the hash functions returning numerical values between 0 and N−1. An element of the array corresponding to each of the M-results is set to one. This is repeated for all data objects in the search domain.

To determine if another data object is in the search domain, the M-hash functions are performed on the data object and the M-results are used to check whether each index corresponding to the results is set to one. If each index is one, a match is likely, although a false positive may result. The likelihood of a false positive depends on, among other things, the value of M and N. A false negative will not result, however.

The Bloom filter is formed using a union of vectors of length N, with M-bits set to one and the rest to zero. These vectors are what is known as a sparse data representation (SDR), because the value of N>>M, which helps to minimalize false positives. Further, a search for incoming data using the Bloom filter involves transforming the incoming data to an SDR, and then doing a bitwise comparison with the Bloom filter, which is itself a union of SDRs, and may itself be (but is not strictly required to be) an SDR.

The concepts described above may also be used in other computational fields. For example, some neural network systems model neurons as unions of SDRs, and incoming sensory data is encoded as SDRs and compared to the neural model. Matches between the incoming encoded data and the model can be used to categorize the incoming data and reinforce or de-emphasize neural connections. While there may be some differences in how the SDRs are formed in a neural network (e.g., some neural models may require the bit positions have semantic meaning), the underlying processing (e.g., unions, compares) is similar to that of a Bloom filter.

Figure 1:
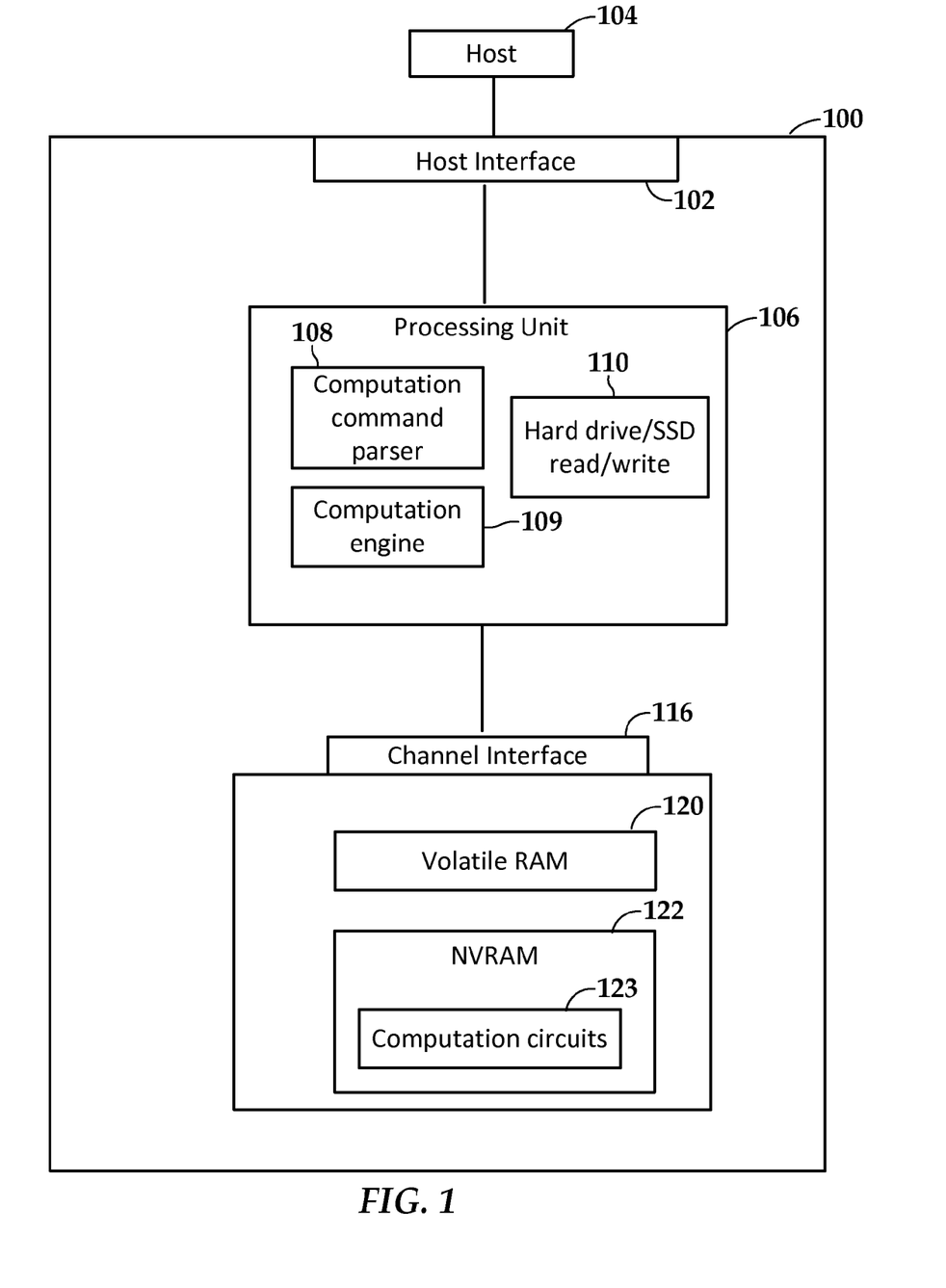
FIG. 1 is a block diagram of a storage compute device according to an example embodiment.

In embodiments described below, a storage compute device includes features for performing these and other vector or matrix operations. Some operations can be performed directly in solid state memory chips without the need for moving the vector/matrix data in and out of the memory chips to a controller. In FIG. 1, a block diagram shows a storage compute device 100 according to an example embodiment. The storage compute device 100 may provide capabilities usually associated with data storage devices, e.g., storing and retrieving blocks of data, and may include additional computation abilities as noted above. Generally, the storage compute device 100 includes a host interface 102 configured to communicate with a host 104. The host interface 102 may use electrical specifications and protocols associated with existing hard drive host interfaces, such as SATA, SaS, SCSI, PCI, Fibre Channel, etc.

The storage compute device 100 includes a processing unit 106. The processing unit 106 includes hardware such as general-purpose and/or special-purpose logic circuitry configured to perform functions of the storage compute device 100, including functions indicated in functional blocks 108-110. Functional block 110 provides legacy hard drive or SSD functionality, such as read, write, verify operations, and key-value associations on stored data. Blocks 108 and 109 represent specialized functionalities that allow the storage compute device 100 to provide internal computations on behalf of the host 104.

Block 108 represents a command parser that manages object-specific and computation-specific communications between the host 104 and storage compute device 100. For example, the block 108 may process commands that define objects (matrices, vectors, scalars, sparse distributed representations) and operations (e.g., scalar/matrix mathematical and logical operations) to be performed on the objects. A computation engine 109 performs the operations on the objects, and may be specially configured for a particular class of operation. For example, if the storage compute device 100 is configured to perform a set of matrix operations, then the computation engine 109 may be optimized for that set of operations. The optimization may include knowledge of how best to store and retrieve objects; including but not limited to array or matrix element stride values for the particular storage architecture used by the storage compute device 100, and how to combine and compare data objects.

As noted above, the functional blocks 108-110 at some point will access persistent storage, and this can be done by way of a channel interface 116 that provides access to memory 118. There may be a multiple channels, and there may be a dedicated channel interface 116 and computation engine 109 for each channel. The memory 118 may include both volatile memory 120 (e.g., Flip/Flops, Latches, DRAM and SRAM) and non-volatile memory 122 (e.g., flash memory, magnetic media, static random-access memory, resistive random-access memory, magnetoresistive random-access memory). The volatile memory 120 may be used as a cache for read/write operations performed by read/write block 110, such that a caching algorithm ensures data temporarily stored in volatile memory 120 eventually gets stored in the non-volatile memory 122. The computation blocks 108, 109 may also have the ability to allocate and use volatile memory 120 for calculations. Intermediate results of calculations may remain in volatile memory 120 until complete and/or be stored in non-volatile memory 122.

In this embodiment, the non-volatile memory 122 includes computation circuits 123 that facilitate doing computations within the non-volatile memory package. For example, the non-volatile memory 122 may include NAND flash memory, which can perform union operations by selecting a plurality of blocks (e.g., word lines) that share common bit lines. The bit lines of the NAND flash memory include a series-connected string of floating-gate transistors (e.g., field-effect transistors) along the bit lines. As will be described in greater detail below, the string will naturally perform a logical combination (e.g., logical OR) of all selected transistors in the string, and can do so in a single read operation. This facilitates performing a logical union of all the bits in all of the selected words, and can be used to perform a union of SDRs.

Figure 2:
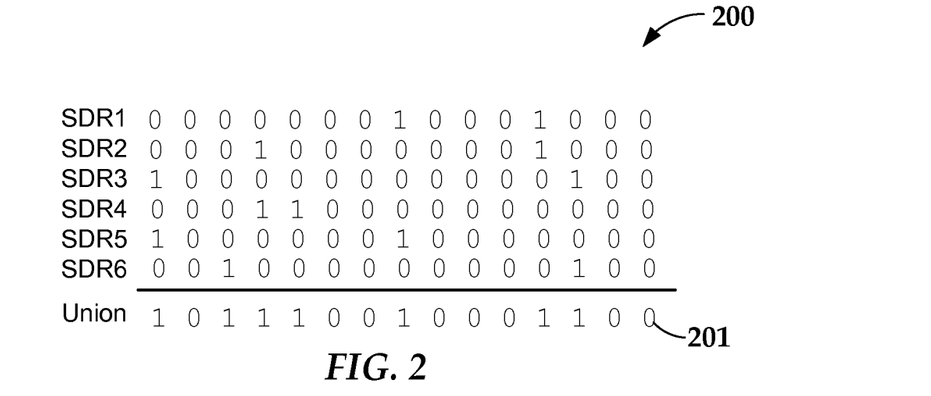
FIG. 2 is a table showing a union operation of sparse data representations according to an example embodiment.

In reference to FIG. 2, a table 200 shows a union operation of SDRs according to an example embodiment. The SDRs are presented for purposes of illustration, and may not be considered "sparse" for some applications. For example, for each 15-bit wide SDR1-6 in table 2, two bits are turned on, resulting in about 87% of the bits being zero. Even so, the concepts shown are applicable regardless of the sparsity and/or length of the data objects.

Figure 3:
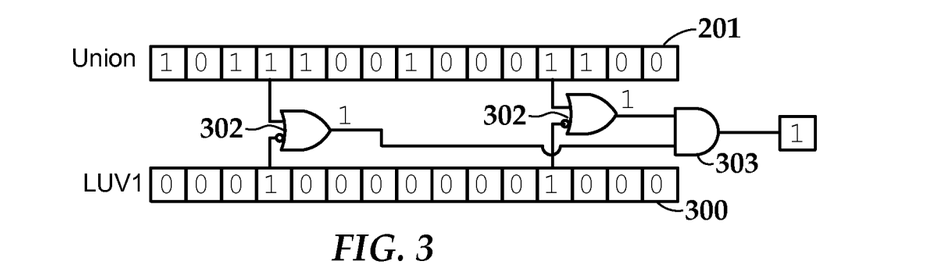
FIGS. 3 and 4 are block diagrams illustrating a comparison between an input value and a combination.
Figure 4:
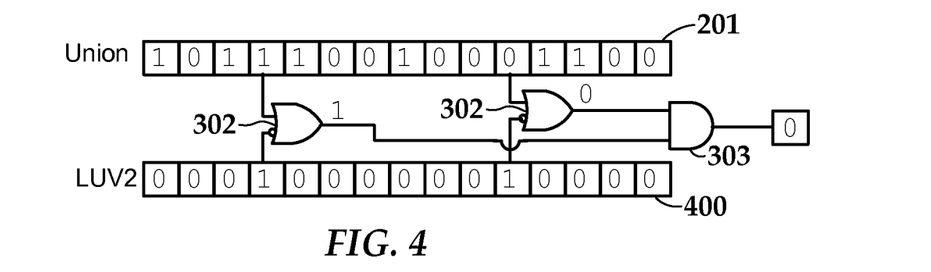

Generally, each bit of the union value 201 is a logical OR of all the bits in the column above. The union value 201 may be determined once and stored statically in memory, or continually updated in memory. The union value 201 may be compared to an input value, such as a key used to perform a search in a Bloom filter or sensor inputs applied to neural network, both of which may include sparse input values. In FIGS. 3 and 4, a block diagram illustrates how this comparison can be performed. In FIG. 3, a lookup value, e.g., sparse input 300 is stored in a comparison register. The sparse input value 300 has the same bit pattern as SDR2 in FIG. 2, and so will return true (1) based on the comparison with the union value 201, which is stored in a combinatorial register.

The logic to perform the comparison can be implemented in software, or as shown here, via logic circuits coupled to the comparison and combinatorial registers. In particular, OR gates 302 have an inverted input coupled to a bit of the sparse input 300, and a non-inverted input coupled to a corresponding bit of the union 201. The outputs of the OR gates 302 are input to an AND gate 303. This type of OR gate 302 is coupled to all corresponding bits of the sparse input 300 and union 201, but those additional gates are not shown here to maintain clarity in the drawing. All of the OR gates 303 are input to the AND gate 303. These logic function gates may be explicit or implied by wiring constructs in the flash architecture.

The comparison determines whether bits with a value of one (or 1-bit) in the sparse input value 300 matching a corresponding 1-bit in the union 201. The comparison doesn't test zeros in the input value 300, so for these 0-bits the comparison is true regardless of the value of bits of the union 201 that correspond to 0-bits of the sparse input 300. The OR gates 302 will only output a false/zero if there is a 1-bit in the sparse input 300 and the corresponding bit in the union 201 is a 0-bit. This is seen in FIG. 4, where the 11$^{th}$ bit from the left in lookup value 400 is a 1, but the corresponding, 11$^{th}$ bit in the union 201 is a 0, and so the outputs of the rightmost OR gate 302 and the AND gate 303 are 0.

In some cases, it may be useful to combine a set of SDRs into number of different unions. In the case of a Bloom filter, this may be used to define different search sub-domains. In the case of neural networks, this may be used to apply inputs to subsets of the network, e.g., to reduce processing/power. An example of forming sets of unions is shown in the block diagram of FIG. 5.

Figure 5:
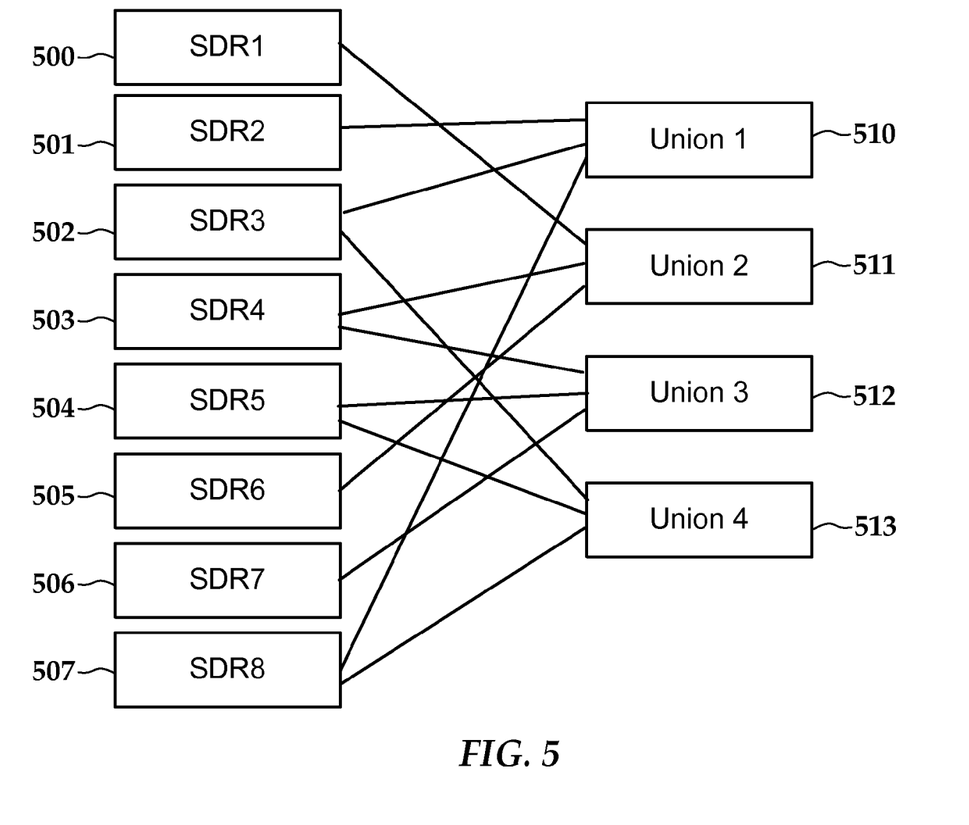
FIG. 5 is a block diagram showing sets of unions according to an example embodiment.

Generally, SDRs 500-507 are a set of SDRs that are used to form different unions 510-513. Each union 510-513 includes a logical OR of the bits of three of the SDRs 500-507. For example, the bits of union 510 include a bitwise OR of SDRs 501, 502, and 507. The use of a fixed number of SDRs per union is presented for purposes of illustration. In some applications, different numbers of SDRs may form each union, and the number of SDRs per union may change over time.

As noted above, NAND flash memory includes a structure that is suited for determining unions of data sets. An example NAND flash structure is shown in the circuit diagram of FIG. 6. Bit lines 600-603 each include series-connected floating gate transistors, e.g., field-effect transistors (FETs) 600a-d. Control transistors, e.g., FETs 600e-f, may be included at one or both ends of each bit line 600-603 to selectably apply gate voltages across the NAND string via control lines (not shown). A plurality of sense amplifiers 610-613 detect an amount of current that passes through the bit lines 600-603 during read operations.

Figure 6:
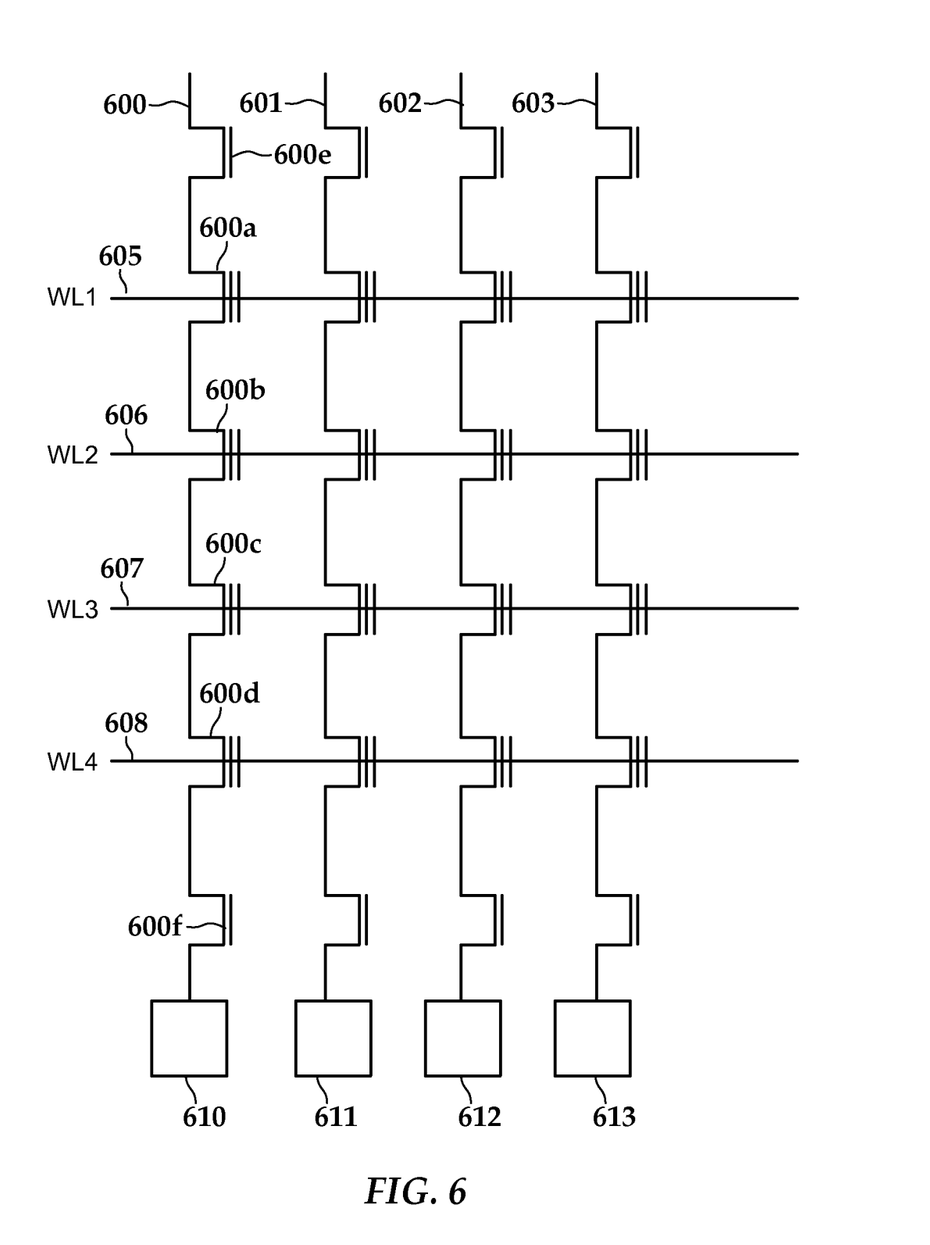
FIG. 6 is a circuit diagram of a NAND flash according to an example embodiment.

A plurality of word lines 605-608 are coupled to control gates of the NAND strings. Selection of one of the word lines 605-608 by a controller causes the cells coupled to the selected word line to pass current above a threshold depending on a value programmed into the cell. The cells connected to unselected word lines will pass current regardless of the program state. The "selection" or "unselecting" of the line may involve applying or removing a voltage across the control gates, and the concepts described herein are independent of the particular voltages used for selecting lines.

Reading a block of memory (e.g., a page) involves selecting a word line 605-608, and detecting current flowing through each bit line 600-603 via the respective sense amplifiers 610-613 at a threshold voltage. For SLC memory, each cell stores a single bit, and so a single voltage threshold is used to define state of the cell. For MLC memory, each cell stores two bits and so four threshold voltages are used to define the state of the cell. Additional threshold voltages can be used to store more bits for TLC, QLC etc.

While the simplified example shows four bit lines 600-603 and four word lines 605-608, most flash storage devices will use a significantly larger number of both lines and associated memory cells, and the number of bit lines may be significantly larger than the number of word lines. The programming and reading of data from cells may occur in a number of different ways depending on the type of memory. For example, the SLC cells of a word line will be read together into a single page. However, MLC cells include a most significant bit (MSB) and least significant bit (LSB), and the LSB and MSB may be part of different pages stored in the memory.

During a page read operation, a single word line 605-608 is selected at a time during a read, in which case the sense amplifiers 610-613 detect bits of at least part of a page associated with the word line. This reading may involve other operations, such as channel decoding and error correction, after which the binary data read from the page can be transferred via internal data channels to a host interface (or for internal use).

In the present embodiments, instead of reading data from a single page, two or more stored pages are combined as they are being read. This may involve simultaneously selecting more than one word line, and the result read is a union of the selected pages (or parts thereof). In other embodiments, two or more word lines are read in sequence, and a register or buffer combines the data from the word lines as each is being read. This may facilitate quickly calculating the combination (e.g., union, intersection) of data sets, and may involve other operations on the data channels, such as a comparison.

Figure 7:
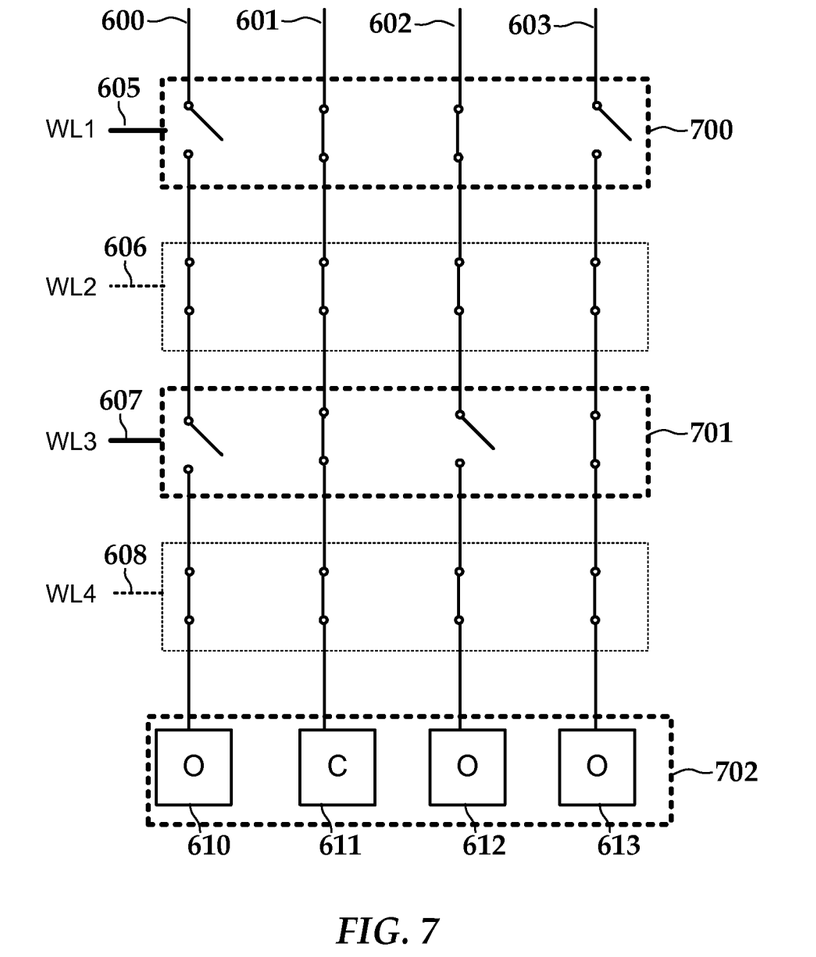
FIG. 7 is a block diagram showing a combination of two data words obtained by selecting two or more word lines in the example of FIG. 6.

In FIG. 7, a block diagram shows how a combination of two data words can be obtained by selecting two or more word lines in the example of FIG. 6. The cells have been simplified as switches, either passing sufficient current at a reference voltage to be considered a closed circuit (C), otherwise being considered an open circuit (O). Word lines 605 and 607 have been selected as indicated by the bold lines, and store respective data words 700 and 701. The word lines 606 and 608 have been deselected, and so will always carry current.

In one configuration, the open circuit would be an "on" bit (1), and the closed circuit would be an "off" bit (0). In such a case, the value of word 700 is 1001 and the value of word 701 is 1010. The resulting value 702 detected by the sense amplifiers 610-613 is 1011, which is equal to 1001 OR 1010, the logical union of the words 700, 701. If the reverse convention for representing bits were used (closed is 1 and open is 0) then word 700 is 0110, word 701 is 0101, and the result 702 is 0100, which is the logical AND of words 700 and 701. In such a case, the result 702 is a logical intersection of the words 700, 701. As indicated by Boolean algebra, with the use of complementary values the same technique can produce a logical OR operation.

While the simplified diagram of FIG. 7 shows a single value for each cell, the embodiment need not be limited to SLC memory cells. For example, the cells may be MLC, and the combinations shown may be performed on the MSB or LSB of the cell value. This will need to take into account the analog nature of the cells, as will be discussed in greater detail below. Generally, a multiple selection of series connected SLC cells may be able to be read in a single operation to determine a 1 or 0 value of the bit line by using a similar technique as is used to read data from a single cell, e.g., determining threshold current flow at a certain voltage. A multiple selection of series-connected MLC cells may be read in a single operation to determine a 1 or 0 value of the bit line, or may be performed in multiple operations, one for each word line. In the latter case, additional memory elements (e.g., flip flops or latches) may be used to hold the accumulated value of bits as each word line is read.

Figure 8:
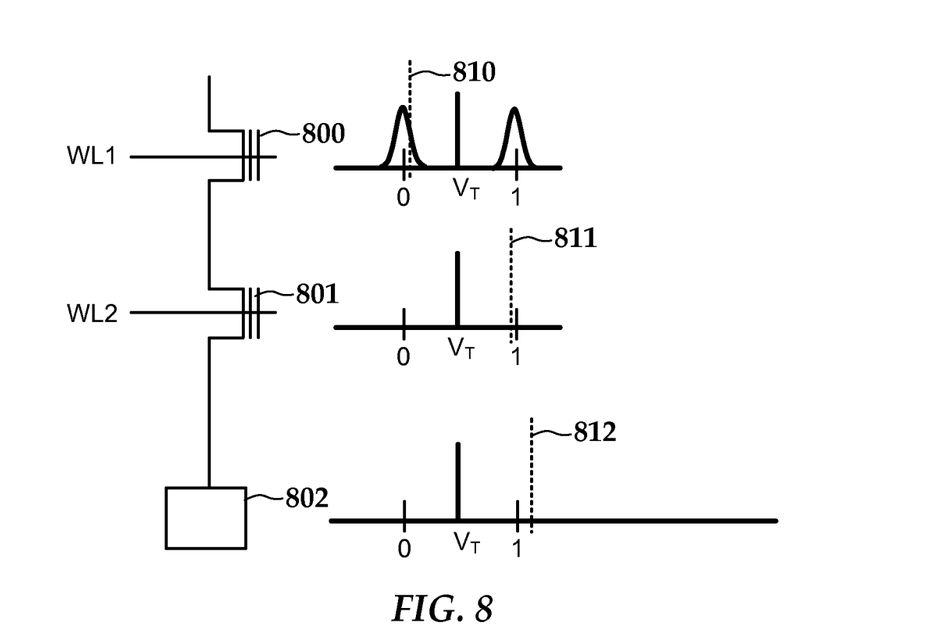
FIGS. 8 and 9 are circuit diagrams illustrating multiple-selection of SLC cells according to an example embodiment.
Figure 9:
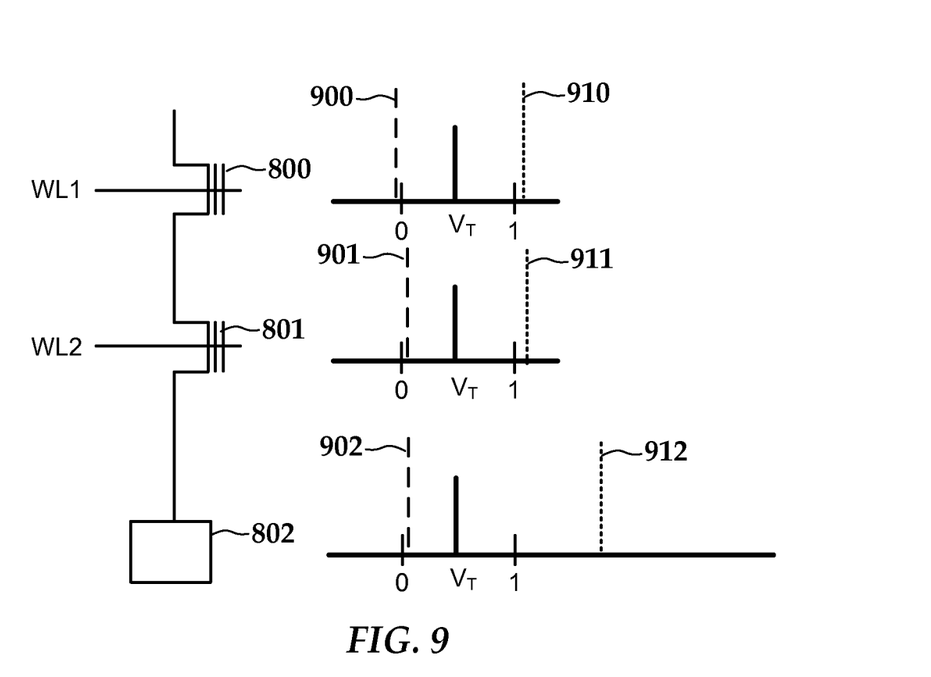

An example how multiple-selected SLC cells may behave is shown in FIGS. 8 and 9. In FIG. 8, cells 800 and 801 are selected. A current is applied into the source of device 800, and the current flowing through the cells will reach a threshold value depending on what is programmed in the cells. As seen in the graphs to the right of the cells 800, 801, a threshold voltage below $V_T$ indicates a 0 value, and threshold voltage above $V_T$ indicates a 1 value. Dashed lines 810, 811 indicate a measured threshold voltage of the cells 800, 801 if they are individually selected. Line 812 indicates the value read from the cells 800, 801 in series, indicating a 1 value, which is the logical OR of 1 and 0. This assumes the voltage indicated by 810 is small.

It should be noted that the convention shown here is opposite of what may be used generally to represent value in an SLC. For example, the erased state of a conventional SLC cell (to the left of $V_T$) may be a 1 value and, and the programmed state (to the right of $V_T$) may be a 0. The illustrated embodiment may be adapted to use the same convention (and thereby use existing processing circuits that are used for conventional storage operations) by inverting the bits of data that are stored and combined, as well as inverting the results. In another embodiment, using this conventional representation with uninverted data would result in a logical AND of the bits. For purposes of the discussion of FIG. 9, the convention shown in FIG. 8 will be assumed.

In FIG. 9, the memory cells 800, 801 are shown in two states where the cells 800,801 are storing the same value. As indicated by threshold voltages 900-902, both cells 800,801 being in the 0 state result in the 0 state being sensed for both cells 800,801 selected together. As indicated by threshold voltages 910-912, both cells being in the 1 state results in the 1 state being sensed for both cells 800,801 selected together.

Figure 10:
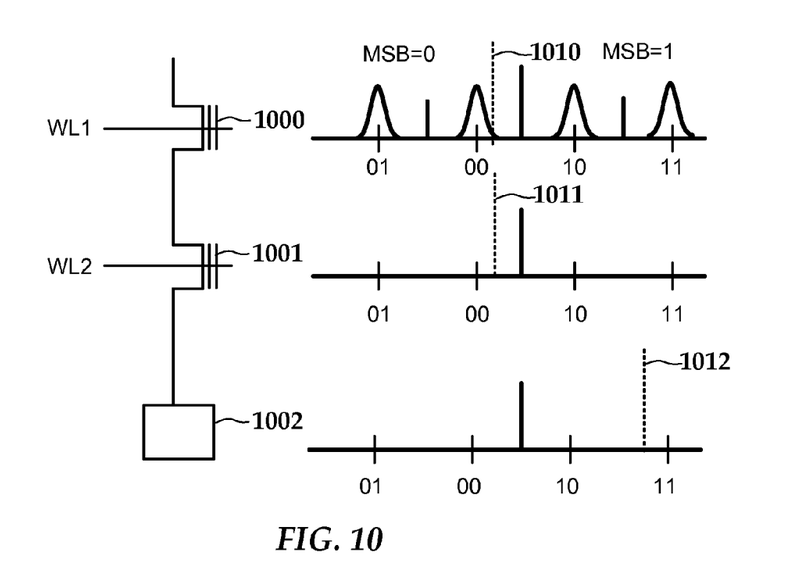
FIG. 10 is a circuit diagram illustrating multiple-selection of MLC cells according to an example embodiment.

An example how multiple-selected MLC cells may behave is shown in FIG. 10, where cells 1000 and 1001 are selected. A current is applied into the source of device 1000, and the current flowing through the cells will reach a threshold value depending on what is programmed in the cells. As seen in the graphs to the right of the cells 1000, 1001, there are three threshold sensing voltages that define four different states each associated with a two-bit value. As with the SLC example, the illustrated mapping of values (in this case a two-bit Gray code) to states is different than conventionally used for MLC flash memory, which usually has the 11 state at the left.

Dashed lines 1010, 1011 indicate a measured threshold voltage of the cells 1000, 1001 if they are individually selected. Line 1012 indicates the value read from the cells 1000, 1001 in series. Note that because of the illustrated arrangement of data values the voltages, the OR of 00 with 00 results in 11. Generally, because the MLC has more voltage ranges used to map values, the simple analog sum of series connected cells may not always be relied upon to determine a logical OR of the decoded data.

One way to approach this for MLC is to simulate SLC memory, e.g., map the leftmost state to 0 and the rightmost state to 1. In such a case, if the threshold voltage measured by the sense amplifier 1002 is to the right of the center line (e.g., in state 10 or 11), then the combination is 1, and is 0 otherwise. The states may be inversely mapped (leftmost state mapped to 1 and the rightmost state to 0) as described above in the SLC implementations, e.g., obtaining an AND combination at the sense amplifier 1002.

Figure 11:
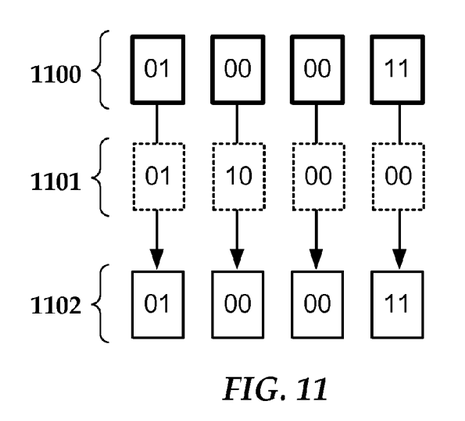
FIGS. 11 and 12 are block diagrams illustrating combining data based on single selection of word lines and a combinatorial register according to an example embodiment.
Figure 12:
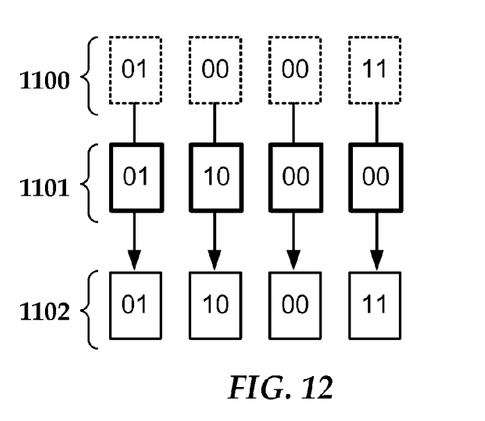

Another way of dealing with this for MLC memory is shown in FIGS. 11-12 (and may also be used with SLC memory). Word lines 1100 and 1101 are individually selected (indicated by bold outline) with the other is deselected. In FIG. 11 word line 1100 is selected and word line 1101 is deselected, and vice versa in FIG. 12. The value of the selected word line is combined to combinatorial register 1102. This can be done for any number of word lines, and the result can be read from combinatorial register 1102.

Figure 13:
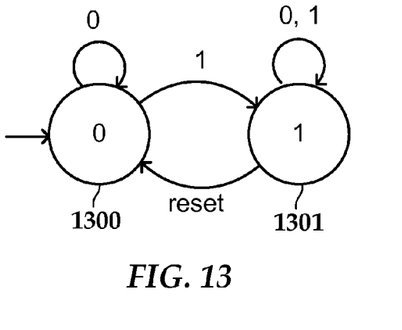
FIGS. 13 and 14 are state diagrams illustrating state machine performance of combinatorial register bits according to an example embodiment.

Each bit of the register 1102 may implement a logical OR state machine as shown in FIG. 13 for each bit of an SLC or MLC flash string. Generally, two state machines would be used for each MLC bit line (one for LSB and one for MSB), and one state machine would be used for each SLC bit line. State 1300 is the initial state of the register bit, and transitions to state 1301 upon a 1 being input to the register bit. The register bit remain in state 1301 thereafter unless reset. The final state can be read after a desire number of word lines have been read. The resulting value stored in the bit registers is a union of each word line.

Figure 14:
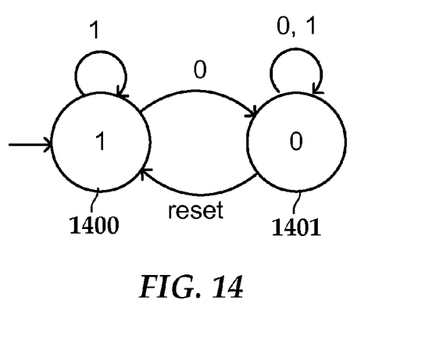

While this embodiment requires more read cycles to combine data than a configuration that combines the analog values of the NAND strings, this embodiment can be adapted for any desired combination by changing the state machine used with the combinatorial register. For example, FIG. 14 illustrates a state machine that can be used to perform a logical AND. State 1400 is the initial state of the register bit, and transitions to state 1401 upon a 0 being input to the register bit. The register bit remain in state 1401 thereafter unless reset. The final state can be read after a desired number of word lines have been read. The resulting value stored in the bit registers is an intersection of each word line.

Figure 15:
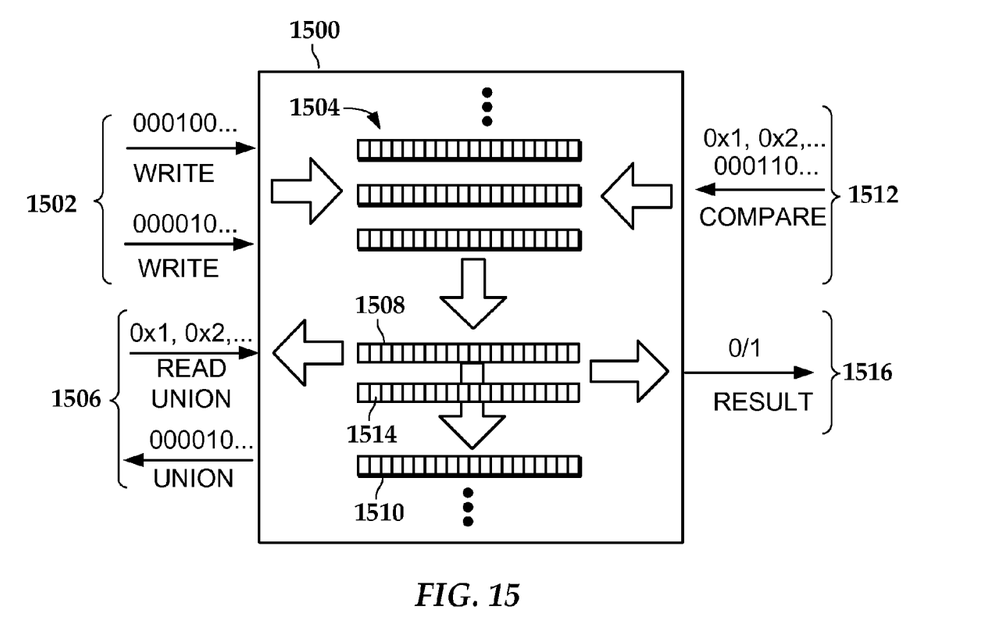
FIG. 15 is a block diagram illustrating an apparatus according to an example embodiment.

In FIG. 15, a block diagram illustrates how previously described features may be utilized by a host according to an example embodiment. An apparatus 1500, e.g., storage compute device, includes a host interface that facilitates communication with a host (not shown) as indicated by arrows outside of the apparatus 1500. The host may write data representations (e.g., sparse representations) via write commands 1502. The data representations are stored in data blocks 1504, e.g., pages in non-volatile, solid-state memory.

The write commands 1502 may arrive at the same time or different times. Generally, the write commands 1502 may designate the data for special processing, e.g., to ensure data representations are stored in data blocks that share bit lines if they are to be combined, designate an identifier that can be used to subsequently access the data representation, etc. The host may subsequently access a combination of the data representations through a read command 1506. For example, the read command 1506 may identify specific representations (e.g., pages) and operations (e.g., union, intersection. In response, the representations are read from data blocks 1504 to a combinatorial register 1508, in one read operation or multiple read operations. Data from the combinatorial register 1508 is sent to the host in response to the command 1506. Data from the combinatorial register 1508 may also be placed in another block 1510 of non-volatile memory, either automatically or at the request of the host.

The host may subsequently request other information regarding the stored data, such as represented by compare request 1512. The compare request 1512 may include both an indicator of data representations (and/or combinations thereof) plus data to compare with those representations. The comparison data can be stored in a comparison register 1514. The data representations may be read from data blocks 1504 to the combinatorial register 1508, which is compared with the comparison register 1514, and a result 1516 sent back to the host. The comparison may be a logical combination (e.g., AND) of the two registers 1508, 1514, or may use a comparison as shown in FIGS. 3 and 4. The result 1516 may be a binary indicator as shown, or some other format (e.g., an intersection of data stored in the registers 1508, 1514).

Figure 16:
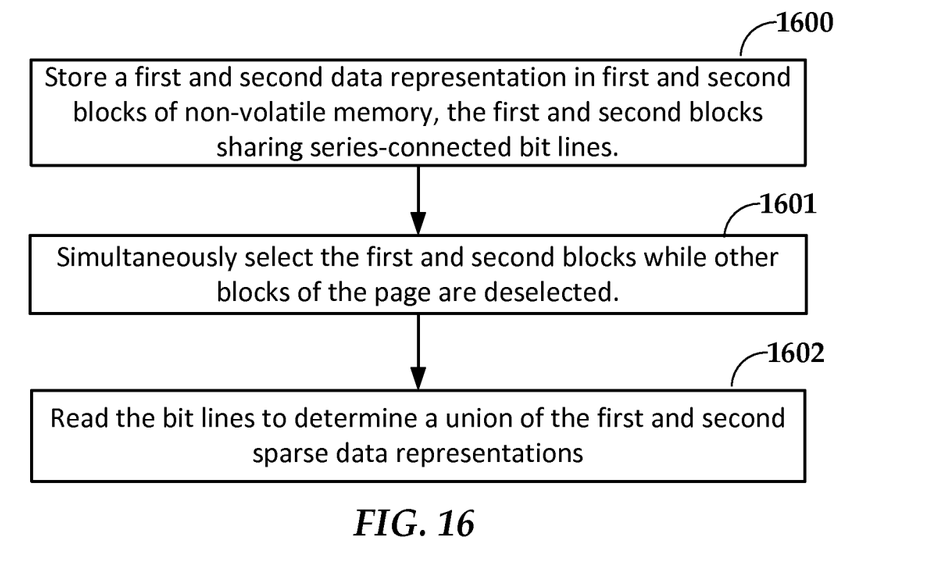
FIGS. 16 and 17 are flowcharts illustrating methods according to an example embodiment.

In FIG. 16, a flowchart illustrates a method according to an example embodiment. The method involves storing 1600 first and second data representations in first and second blocks of non-volatile memory. The first and second blocks share series-connected bit lines. The first and second blocks are simultaneously selected 1601 while other blocks of the page are deselected. The bit lines are read 1602 to determine at least one of a union and an intersection of the first and second data representations.

Figure 17:
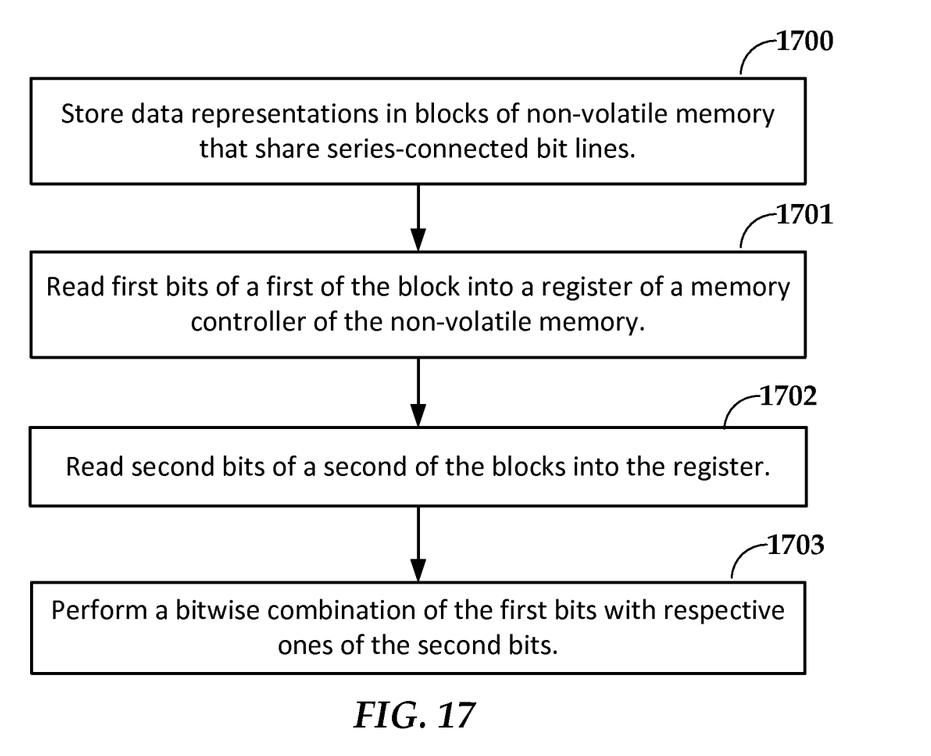

In FIG. 17, a flowchart illustrates a method according to an example embodiment. The method involves storing 1700 data representations in blocks of non-volatile memory that share series-connected bit lines. First bits of a first of the block are read 1701 into a register of a memory controller of the non-volatile memory. Second bits of a second of the blocks are read 1702 into the register, and the register performs 1703 a bitwise combination of the first bits with respective ones of the second bits The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a non-transitory computer-readable medium and transferred to the processor for execution as is known in the art.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination and are not meant to be limiting, but purely illustrative. It is intended that the scope be limited not with this detailed description, but rather determined by the claims appended hereto.

What is claimed is:

1. A method, comprising:
   storing a first and second data representation in first and second blocks of a non-volatile, solid-state memory, the first and second blocks sharing series-connected bit lines;
   selecting the first and second blocks and deselecting other blocks of the non-volatile, solid-state memory that share the bit lines; and
   reading the bit lines to determine a union of the first and second data representations, a union the union comprising a Bloom filter;
   performing a bitwise comparison of input data with the Bloom filter; and
   returning the comparison as a search result of the Bloom filter.

2. The method of claim 1, wherein the first and second blocks comprise first and second word lines.

3. The method of claim 1, further comprising copying the combination to a third block of the non-volatile, solid-state memory.

4. The method of claim 1, wherein the first and second data representation are sparse representations.

5. The method of claim 4, wherein the input data comprises a sparse input.

6. The method of claim 5, wherein the comparison is false only when 1-bits in the sparse input match a corresponding 0-bit in the union.

7. A method, comprising:
   storing data representations in blocks of non-volatile memory that share series-connected bit lines;
   reading first bits of a first of the blocks into a register of a memory controller of the non-volatile memory; and
   reading second bits of a second of the blocks into the register, wherein the register performs a bitwise combination of the first bits with respective ones of the second bits.

8. The method of claim 7, further comprising using the bitwise combination in a bitwise comparison.

9. The method of claim 8, wherein the bitwise comparison is false only when 1-bits of a comparison value match corresponding 0-bits in the bitwise combination.

10. The method of claim 7, wherein the bitwise combination comprises a logical OR, and where the bitwise combination comprises a union of the first block and the second block.

11. The method of claim 7, wherein the bitwise combination comprises a logical AND, and where the bitwise combination comprises an intersection of the first block and the second block.

12. A storage compute device, comprising:
    non-volatile memory comprising a plurality of blocks that share series-connected bit lines, each block comprising a word line;
    a controller logic coupled to the word lines and configured to simultaneously select a first set of two or more blocks and deselect other blocks of the plurality of blocks; and
    a plurality of sense amplifiers coupled to read the bit lines to determine a union of data stored in the first set of blocks, the union representing a neuron of a neural network;
    performing a bitwise comparison of input data with the union; and
    returning the comparison as a categorization of the input data by the neural network.

13. A storage compute device, comprising:
    non-volatile memory comprising a plurality of blocks that share series-connected bit lines, each block comprising a word line;
    a combinatorial register;
    a comparison register;
    a controller logic coupled to the word lines and configured to simultaneously select a first set of two or more blocks and deselect other blocks of the plurality of blocks; and
    a plurality of sense amplifiers coupled to read the bit lines to determine a union of data stored in the first set of blocks, the controller logic further configured to:
    store the union in the combinatorial register;
    store an input in the comparison register;
    perform a bitwise comparison between the combinatorial register to the comparison register; and
    return a result of the comparison.

14. The storage compute device of claim 13, wherein the bitwise comparison is false only when 1-bits of the comparison register match corresponding 0-bits of the combinatorial register.

15. The storage compute device of claim 13, wherein the input comprises sparse data representations.

16. The storage compute device of claim 13, wherein the union comprises one of a Bloom filter and a neural network.

17. The storage compute device of claim 12, wherein the non-volatile memory comprises NAND flash memory.

18. The storage compute device of claim 17, wherein the NAND flash memory comprises SLC memory.

19. The storage compute device of claim 12, wherein the input data comprises sensory data.

20. The storage compute device of claim 12, wherein the categorization is used to reinforce or de-emphasize neural connections of the neural network.

* * * * *